(12) United States Patent
Hahn, III et al.

(10) Patent No.: US 11,721,894 B2
(45) Date of Patent: Aug. 8, 2023

(54) SYSTEM AND METHOD FOR NEAR-FIELD TESTING OF A PHASED ARRAY ANTENNA

(71) Applicant: THE BOEING COMPANY, Chicago, IL (US)

(72) Inventors: Carl J. Hahn, III, Inglewood, CA (US); Jeffrey T. McCollam, Huntington Beach, CA (US); Paul Christian Werntz, Long Beach, CA (US)

(73) Assignee: The Boeing Company, Chicago, IL (US)

( * ) Notice: Subject to any disclaimer, the term of this patent is extended or adjusted under 35 U.S.C. 154(b) by 522 days.

(21) Appl. No.: 16/839,977

(22) Filed: Apr. 3, 2020

(65) Prior Publication Data

US 2023/0029048 A1    Jan. 26, 2023

(51) Int. Cl.
  *H01Q 3/26* (2006.01)
  *H01Q 3/36* (2006.01)
  *G01R 29/10* (2006.01)

(52) U.S. Cl.
  CPC ............. *H01Q 3/267* (2013.01); *G01R 29/10* (2013.01); *H01Q 3/36* (2013.01)

(58) Field of Classification Search
  CPC ........... H01Q 3/267; H01Q 3/36; G01R 29/10
  See application file for complete search history.

(56) References Cited

U.S. PATENT DOCUMENTS 3,387,301 A * 6/1968 Blass ....................... H01Q 3/46
                                                    342/377
4,720,712 A * 1/1988 Brookner ............. H01Q 3/2617
                                                    342/383
(Continued)

FOREIGN PATENT DOCUMENTS

| CN | 106685484 A | 5/2017 |
|---|---|---|
| CN | 108594026 A | 9/2018 |

(Continued)

OTHER PUBLICATIONS

Beam. (1992). Academic Press Dictionary of Science and Technology (4th ed.). Elsevier Science & Technology. Credo Reference: https://search.credoreference.com/content/entry/apdst/beam/0 (Year: 1992).*

(Continued)

*Primary Examiner* — Bernarr E Gregory
*Assistant Examiner* — Fred H Mull
(74) *Attorney, Agent, or Firm* — Armstrong Teasdale LLP

(57) ABSTRACT

A near-field test system for a phased array antenna includes a probe, a beam forming network, and a computing system. The probe is disposed at a fixed position in a near-field of the phased array antenna and transmits a test beam toward a fixed location on the phased array. The beam forming network is coupled to the phased array and includes a plurality of phase shifters and a beam summer. The phase shifters steer received beams for each antenna element of the phased array to form a planar wave front. The beam summer is coupled to the phase shifters and combines power of the received beams. The computing system is coupled to the beam forming network and scales combined power of the received beams and generates a virtual spectrum for the phased array antenna from scaled power of the received beams.

19 Claims, 12 Drawing Sheets

(56) References Cited

U.S. PATENT DOCUMENTS

| | | | | |
|---|---|---|---|---|
| 4,939,527 | A * | 7/1990 | Lamberty | H01Q 21/061 |
| | | | | 343/754 |
| 6,163,296 | A | 12/2000 | Lier et al. | |
| 6,507,315 | B2 * | 1/2003 | Purdy | H01Q 25/00 |
| | | | | 342/174 |
| 6,784,838 | B2 * | 8/2004 | Howell | H01Q 25/00 |
| | | | | 455/562.1 |
| 8,212,716 | B2 | 7/2012 | Goshen et al. | |
| 9,151,828 | B2 | 10/2015 | Shipley | |
| 9,331,751 | B2 | 5/2016 | Sikina et al. | |
| 10,505,275 | B2 | 12/2019 | Lee | |
| 10,615,495 | B1 * | 4/2020 | Loui | H01Q 3/267 |
| 2005/0110678 | A1 * | 5/2005 | Doi | H01Q 3/267 |
| | | | | 342/372 |
| 2015/0349420 | A1 * | 12/2015 | O'Haver | H04B 7/0617 |
| | | | | 342/371 |
| 2018/0090837 | A1 * | 3/2018 | Schmidt | H01Q 3/267 |

FOREIGN PATENT DOCUMENTS

| | | |
|---|---|---|
| CN | 109150325 A | 1/2019 |
| CN | 110361705 A | 10/2019 |
| CN | 110600890 A | 12/2019 |
| WO | WO-2021113979 A1 * | 6/2021 |

OTHER PUBLICATIONS

Beam. (2001). Hargrave's Communications Dictionary, Wiley. Credo Reference: https://search.credoreference.com/content/entry/hargravecomms/beam/0 (Year: 2001).*

W.P.M. N.Keizer, Fast and Accurate Array Calibration Using a Synthetic Array Approach, IEEE Transactions on Antennas and Propagation, vol. 59(11), p. 4115-4122, Nov. 2011 (Year: 2011).*

Fixed. (2007). In R. E. Allen (Ed.), The Penguin English Dictionary (3rd ed.). Penguin. Credo Reference: https://search.credoreference.com/content/entry/penguineng/fixed/0 (Year: 2007).*

* cited by examiner

SYSTEM AND METHOD FOR NEAR-FIELD TESTING OF A PHASED ARRAY ANTENNA

FIELD

The field of the disclosure relates generally to testing of phased array antennas and, more specifically, to a system and method for near-field testing of a phased array antenna to produce a far-field pattern.

BACKGROUND

Conventional testing of electronically scanned antennas, such as phased array antennas including, for example, single-beam or multi-beam active array antennas found on space vehicles, communication systems, aircraft, radio towers, or other platform operating at radio frequencies, involves either far-field characterization or near-field characterization that is then translated to a far-field antenna pattern. Near-field characterization conventionally includes rastor-scanning the amplitude and phase of the near-field electromagnetic radiation of the antenna, and then using a two-dimensional Fourier transform to translate the near-field measurements to a far-field antenna pattern. For a multi-beam antenna, the rastor-scan and translation to far-field are repeated for each beam.

In far-field testing, for example, of a phased array antenna on an orbiting space vehicle, e.g., a satellite, each beam is pointed in a different direction and differentiated from the next by frequency (e.g., frequency division multiple access, or FDMA), by time (e.g., time division multiple access, or TDMA), or by code (e.g., code division multiple access, or CDMA). A portion of each beam is received at a reference antenna, e.g., on the ground. Given that the azimuth and elevation of each beam relative to the reference antenna is known, and given that each beam is differentiated in some manner from the next, the received power of each beam can be normalized and mapped to represent a far-field pattern.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF DESCRIPTION

One aspect of the present disclosure includes a near-field test system for a phased array antenna includes a probe, a beam forming network, and a computing system. The probe is disposed at a fixed position in a near-field of the phased array antenna and is configured to receive at least a portion of a test beam radiated by the phased array antenna. The beam forming network is coupled to the phased array antenna and includes a plurality of phase shifters configured to steer the test beam to a position in the near-field when radiated by an array of antenna elements of the phased array antenna. The computing system is coupled to the probe and is configured to scale received power of the test beam, and generate a far-field antenna pattern for the phased array antenna from scaled received power of the test beam.

Another aspect of the present disclosure includes a method of near-field testing of a phased array antenna having an array of antenna elements, the method includes steering a test beam to a beam position in a near-field of the phased array antenna. The method includes disposing a probe at a fixed position in the near-field of the phased array antenna. The method includes phase shifting the test beam supplied to each element of the array of antenna elements to apply a spherical phase taper across the array to generate a spherical wave front focused at the probe and to equalize path length phase from each element of the array to the probe. The method includes receiving at least a portion of the test beam at the probe. The method includes scaling received power of the test beam. The method includes generating a far-field antenna pattern for the phased array antenna from scale received power of the test beam.

Yet another aspect of the present disclosure includes a beam forming network for near-field testing of a phased array antenna, the beam forming network includes a plurality of phase shifters and a microcontroller. The plurality of phase shifters is coupled to a signal generator. Each phase shifter is configured to receive a test beam from the signal generator and apply a corresponding phase shift to the test beam. The phase shifter supplies the test beam to an element of an array of antenna elements of the phased array antenna. The microcontroller is coupled to the plurality of phase shifters for controlling the corresponding phase shift of each element of the array. The microcontroller is configured to adjust the corresponding phase shift of each element to steer the test beam to a position in the near-field of the phased array antenna when radiated by the array, and adjust the corresponding phase shift of each element to apply a spherical phase taper across the array to generate a spherical wave front focused at a probe disposed in the near-field of the phased array antenna and to equalize path length phase from each element of the array to the probe when the test beam is radiated by the array.

Yet another aspect of the present disclosure includes a near-field test system for a phased array antenna. The near-field test system includes a probe, a beam forming network, and a computing system. The probe is disposed at a fixed position in a near-field of the phased array antenna and is configured to transmit a test beam toward a fixed location on the phased array antenna. The beam forming network is coupled to the phased array antenna and includes a plurality of phase shifters and a beam summer. The plurality of phase shifters is configured to steer received beams for each antenna element of the phased array antenna to form a planar wave front when radiated by the probe. The beam summer is coupled to the plurality of phase shifters and is configured to combine power of the received beams. The computing system is coupled to the beam forming network and is configured to scale combined power of the received beams and generate a virtual spectrum for the phased array antenna from scaled power of the received beams.

Yet another aspect of the present disclosure includes a method of near-field testing of a phased array antenna having an array of antenna elements. The method includes transmitting a test beam toward a fixed location on the phased array antenna from a probe at a fixed position in the near-field of the phased array antenna. The method includes receiving at least a portion of the test beam at each antenna element. The method includes phase shifting the received beams from each antenna element to apply a spherical phase taper across the array to correct a spherical wave front detected by each antenna element resulting from unequal path length phases from each antenna element to the probe, thereby producing a planar wave front. The method includes combining power of the received beams. The method includes scaling combined power of the received beams. The method includes generating a virtual spectrum for the phased array antenna from scaled power of the received beams.

Yet another aspect of the present disclosure includes a beam forming network for near-field testing of a phased array antenna. The beam forming network includes a plurality of phase shifters and a microcontroller. The plurality of phase shifters is coupled to respective antenna elements of the phased array antenna. Each phase shifter is configured to receive a received beam from the respective antenna element, apply a corresponding phase shift to the received beam, and supply the received beam to a beam summer. The microcontroller is coupled to the plurality of phase shifters for controlling the corresponding phase shift of each element of the array. The microcontroller is configured to adjust the corresponding phase shift of each element to apply a spherical phase taper across the array to correct a spherical wave front detected by each antenna element resulting from unequal path length phases from each antenna element to the probe, thereby producing a planar wave front.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated examples may be incorporated into any of the above-described aspects, alone or in any combination.

Figure 1:
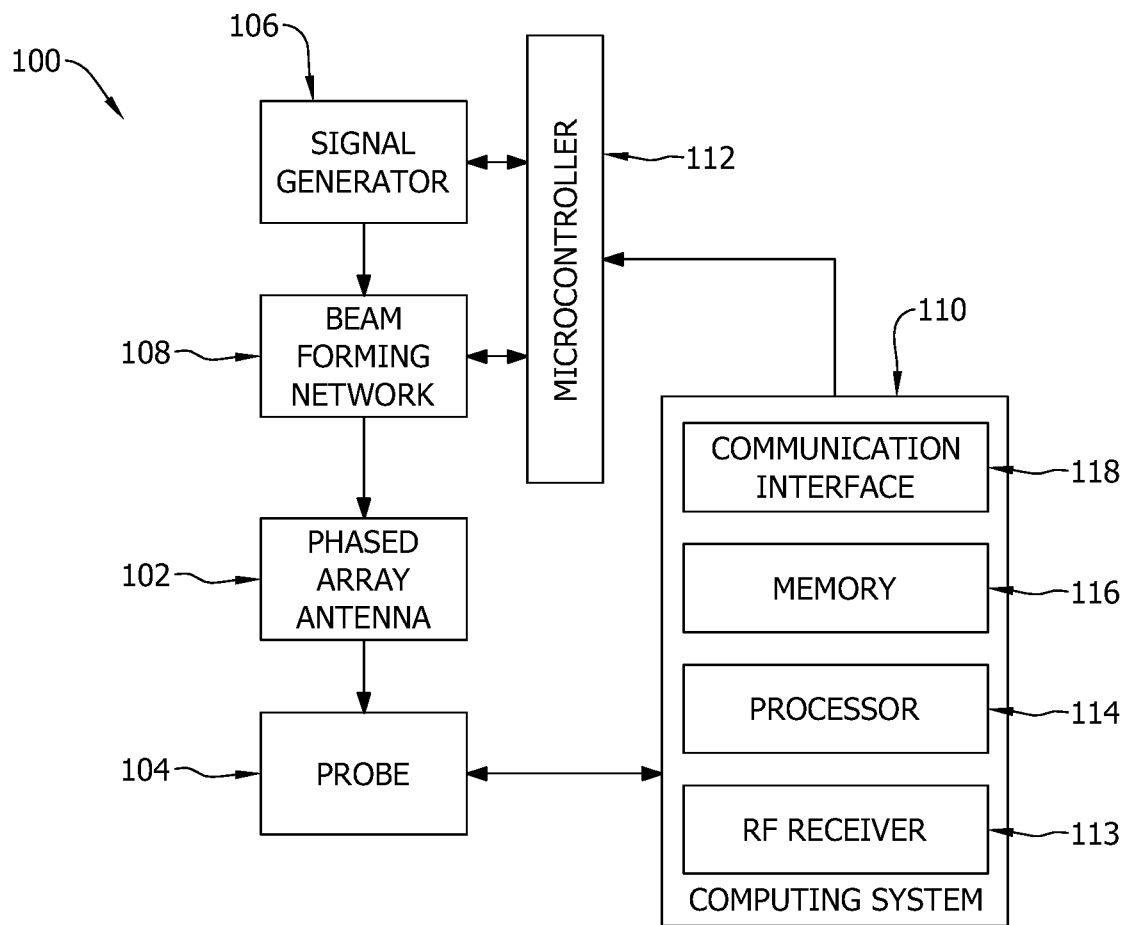
FIG. 1 is a block diagram of an example near-field test system for a transmitting phased array antenna.

Corresponding reference characters indicate corresponding parts throughout the several views of the drawings. Although specific features of various examples may be shown in some drawings and not in others, this is for convenience only. Any feature of any drawing may be referenced and/or claimed in combination with any feature of any other drawing.

DETAILED DESCRIPTION

Embodiments of the systems and methods described generally include a near-field test system and a method of near-field testing for a phased array antenna. As an example, the phased array antenna is installed on an orbiting space vehicle, e.g., a satellite. However, the disclosed systems and methods are not limited to satellite applications and can be utilized with phased array antennas in most any communication system and/or radar antenna platform, e.g., installed on aircraft, balloon, radio towers, etc. and operating at radio frequencies, optical frequencies, and/or sonar frequencies. For example, the systems and methods provide near-field testing to produce a "snapshot" of a far-field antenna pattern by electronically scanning the phased array antenna over a probe at a fixed position in the near-field, and using power measurements at the probe to generate the far-field antenna pattern with a single measurement, or "snapshot." The systems and methods may apply to both single-beam and multi-beam phased array antennas, and enable far-field characterization for all beams with as few as a single near-field scan. The systems and methods may include multiple beams simultaneously radiated from the phased array antenna, and each beam is steered to a rastor position in the near-field. At least some embodiments apply a linear phase progression over the antenna elements during beam forming to steer the beam to its corresponding rastor position. In an example, each beam has a unique feature, or discriminator, that enables differentiation of the beams at the probe upon receipt. The unique features may include, for example, a different frequency for each beam, a different timing for each beam, or a different coding for each beam. The systems and methods may also apply a spherical phase taper during beam forming to form a spherical wave front that focuses each beam's energy at the probe and equalizes path length phase among the different elements of the phased array antenna, which are each offset from a center of the phased array antenna by some distance.

In some example systems and methods, the probe receives at least a portion of each beam. A far-field antenna pattern is generated based on the received power of each beam once it is normalized for each beam's known rastor position relative to the fixed position of the probe. Embodiments of the systems and methods implement near-field testing without mechanically rastor-scanning a probe over the surface of the phased array antenna, but instead by taking advantage of the electronic scanning capability native to the phased array antenna under test. Moreover, the far-field pattern is generated with simple power measurements instead of conventional amplitude and phase measurements that must undergo a two-dimensional Fourier transform to arrive at the far-field antenna pattern. Accordingly, the disclosed systems and methods reduce complexity, time, and cost necessary to characterize a phased array antenna in the far-field.

In alternative embodiments, the near-field test system and a method of near-field testing may be used for a receiving phased array antenna. In such embodiments, beams are transmitted by the probe and received by the phased array antenna. Although functionally reversed, the near-field test system and method of near-field testing operate in the same manner for the receiving phased array antenna as for a transmitting phased array antenna. Each system and method effectively tests the phased array antenna, one by transmitting from the phased array antenna and the other by receiving at the phased array antenna. Accordingly, although certain aspects of the following embodiments are described in terms of a transmitting phased array antenna, the same description applies equally when testing a receiving phased array antenna. Likewise, descriptions of certain aspects of some embodiments in terms of a receiving phased array antenna also apply to testing a transmitting phased array antenna.

FIG. 1 is a block diagram of a near-field test system 100 for a phased array antenna 102. Near-field test system 100 includes a probe 104 disposed at a fixed position in the near-field of phased array antenna 102. Near-field test system 100 includes a signal generator 106 and a beam forming network 108 that feed phased array antenna 102. Near-field test system 100 includes a computing system 110 that controls various components of near-field test system 100, including a microcontroller 112 that itself controls components of beam forming network 108 and, in certain embodiments, signal generator 106. In alternate embodiments, signal generator 106 is controlled directly by computing system 110. Computing system 110 includes an RF receiver 113, a processor 114, a memory 116, and a communication interface 118. In alternative embodiments, any one of RF receiver 113, processor 114, memory 116, or communication interface 118 may be implemented in combination with any other of the components of computing system 110. For example, communication interface 118 may be implemented to include RF receiver 113.

Figure 2:
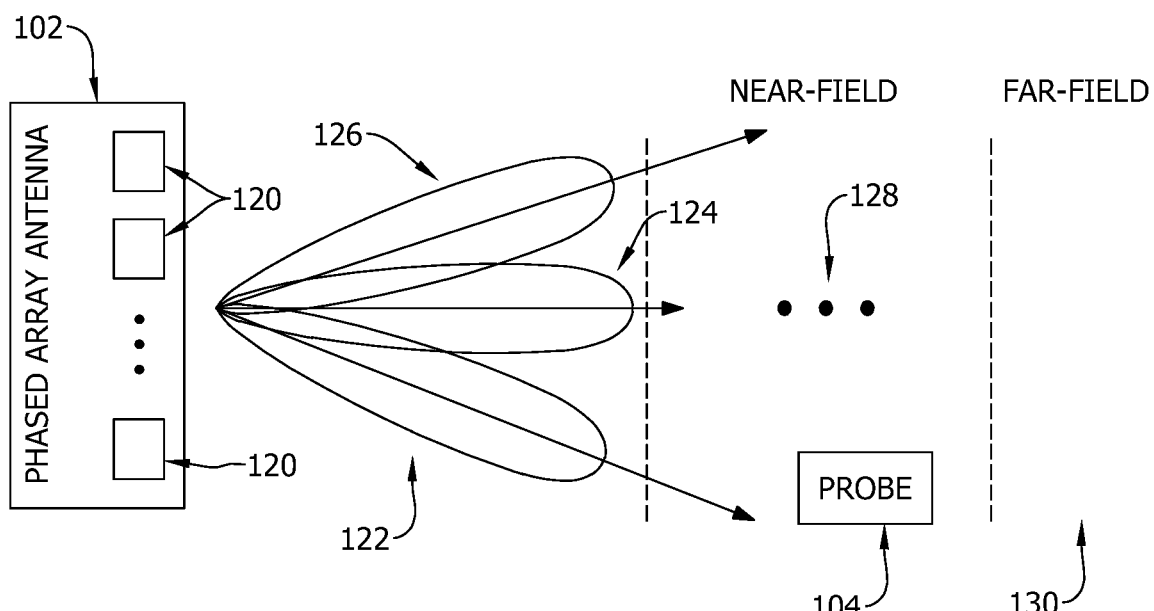
FIG. 2 is a diagram illustrating near-field testing of the phased array antenna shown in FIG. 1.

FIG. 2 is a diagram illustrating near-field testing of phased array antenna 102 shown in FIG. 1. Phased array antenna includes an array of antenna elements 120, each of which simultaneously radiates multiple beams 122, 124, 126 that are pointed to respective rastor positions in the near-field 128 of phased array antenna 102. FIG. 2 illustrates three beams 122, 124, 126, however, in various embodiments, the number of beams radiated may be one or more. FIG. 2 illustrates probe 104 disposed at its fixed position in near-field 128, as opposed to in the far-field 130 of phased array antenna 102, which is generally many-times the wavelength of the beams radiated by phased array antenna 102.

Referring to FIGS. 1 and 2, processor 114 is configured to execute instructions, or program code, stored in memory 116 or any other suitable local or remote memory device. Processor 114, for example, is configured to gain access to program code for receiving, via communication interface 118, and processing test data collected by probe 104 for phased array antenna 102. Such test data can be stored, for example in memory 116. Processor 114 is further configured to gain access to program code for instructing microcontroller 112, via communication interface 118, to independently control phase shifters (not shown) to adjust phases of the electromagnetic waves to be fed to antenna elements 120 of phased array antenna 102 to shape, e.g., steer, the emitted beams 122, 124, 126. Computing system 110 instructs both probe 104 and microcontroller 112 to collect test data, e.g., power measurements, for each beam.

Processor 114 is further configured to gain access to program code for processing the test data collected by probe 104 to scale received power measurements. Such scaling may include, for example, normalizing received power measurements for each beam based on each beam's pointing position, or rastor position, in azimuth and elevation relative to the fixed position of probe 104. In alternative embodiments, processor 114 may reference measured power to a gain standard. Processor 114 maps the scaled power measurements to a far-field antenna pattern.

Figure 3:
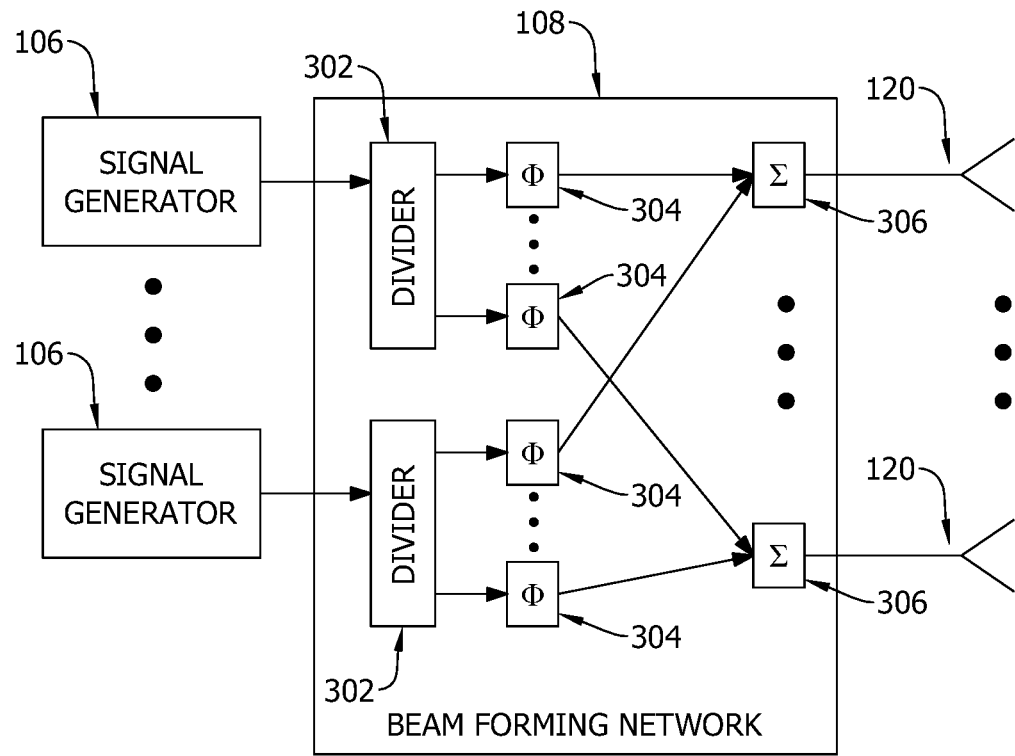
FIG. 3 is a block diagram of the beam forming network shown in FIG. 1.

FIG. 3 is a block diagram of beam forming network 108 shown in FIG. 1. Beam forming network 108 and its various components may be implemented digitally using, for example, a digital signal processor, or may be implemented using discrete analog components. Beam forming network 108 is fed by a plurality of signal generators 106. Each signal generator 106 produces a beam signal having a unique feature, such as a unique frequency, a unique timing, or a unique coding, that distinguishes each beam radiated by phased array antenna 102 from each other. Beam forming network 108 includes, for each beam, a signal divider 302 and a plurality of phase shifters 304. Beam forming network 108 also includes, for each antenna element 120, a beam summer 306. Beam divider 302, or splitter, receives the beam signal from a corresponding signal generator 106 and supplies it to each of its corresponding plurality of phase shifters 304, one phase shifter 304 per antenna element 120. Phase shifters 304 adjust the phase of the beam being supplied to each antenna element, for example, to steer the beam. To steer the beam, phase shifters 304 apply a linear phase progression to antenna elements 120 as a function of each elements position relative to the center of the array. Phase shifters 304 further adjust the phase of the beam to apply a spherical phase taper to equalize path length phase to probe 104 for each antenna element 120 and focus the beam's energy at probe 104. All the phase-shifted beams for a given antenna element 120 are then combined by a corresponding beam summer 306, such that all beams are simultaneously radiated by each antenna element 120. In certain embodiments, beam forming network 108 includes a plurality of amplitude control elements for each antenna element 120. Such amplitude control elements may include, for example amplitude taper control.

Microcontroller 112 controls, for example, each of the plurality of phase shifters 304 of beam forming network 108 independently to modify the respective phase shifts applied to the beam signals supplied by signal generators 106. Further, in certain embodiments, microcontroller 112 is configured to control signal generators 106 to modify, for example, frequency, timing, or coding of the beam signals supplied to beam forming network 108.

Signal generator 106 can include one or more RF or baseband circuits or components, such as, for example, a modulator, amplifier, oscillator, or other wave generator.

Probe 104 includes, for example, an antenna, such as a Potter horn, or other suitable type of antenna for receiving portions of the beams radiated from phased array antenna 102. Probe 104 may also include a power meter for measuring received power from the beams. In alternative embodiments, received power may be measured by RF receiver 113.

Figure 4:
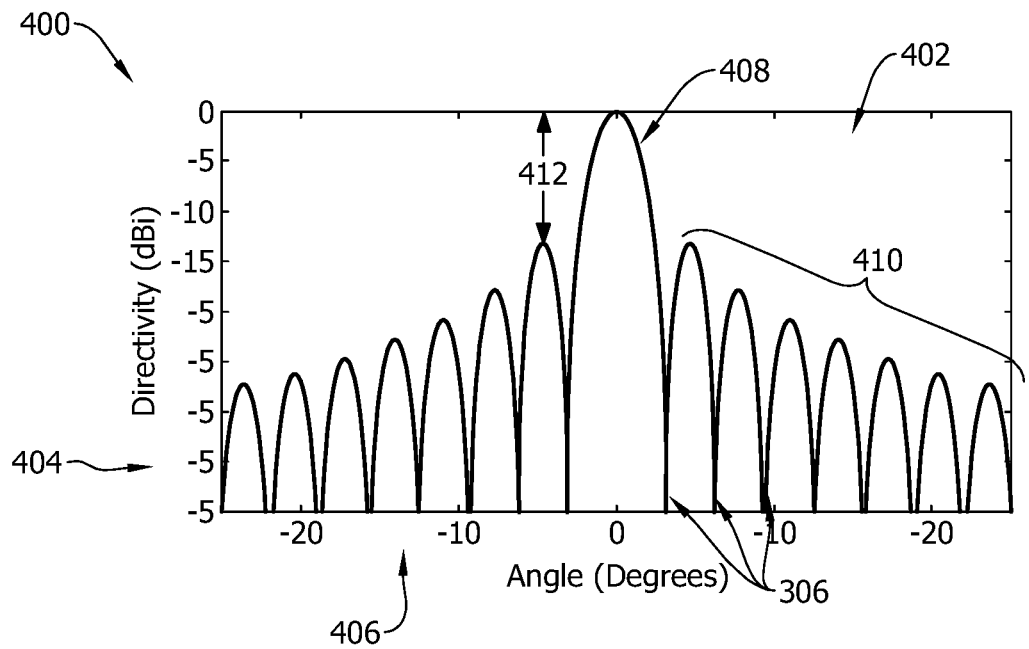
FIG. 4 is a plot of an example antenna pattern.

FIG. 4 is a plot 400 of an antenna pattern 402 in power, or directivity, expressed in decibels on a vertical axis 404, versus pointing angle, expressed in degrees on a horizontal axis 406. Antenna pattern 402 includes a main beam 408 centered at zero degrees, and a plurality of side lobes 410 measured at pointing angles relative to main beam 408. The power shown in antenna pattern 402 is expressed in decibels (dB) relative to main beam 408, main beam 408 accordingly being measured at 0 dB. Side lobes 410 generally exhibit a side lobe power level 412 that is reduced from the power level of main beam 408. For example, in antenna pattern 402, the side lobe power level 412 is about −15 dB relative to the power level of main beam 408.

Figure 5:
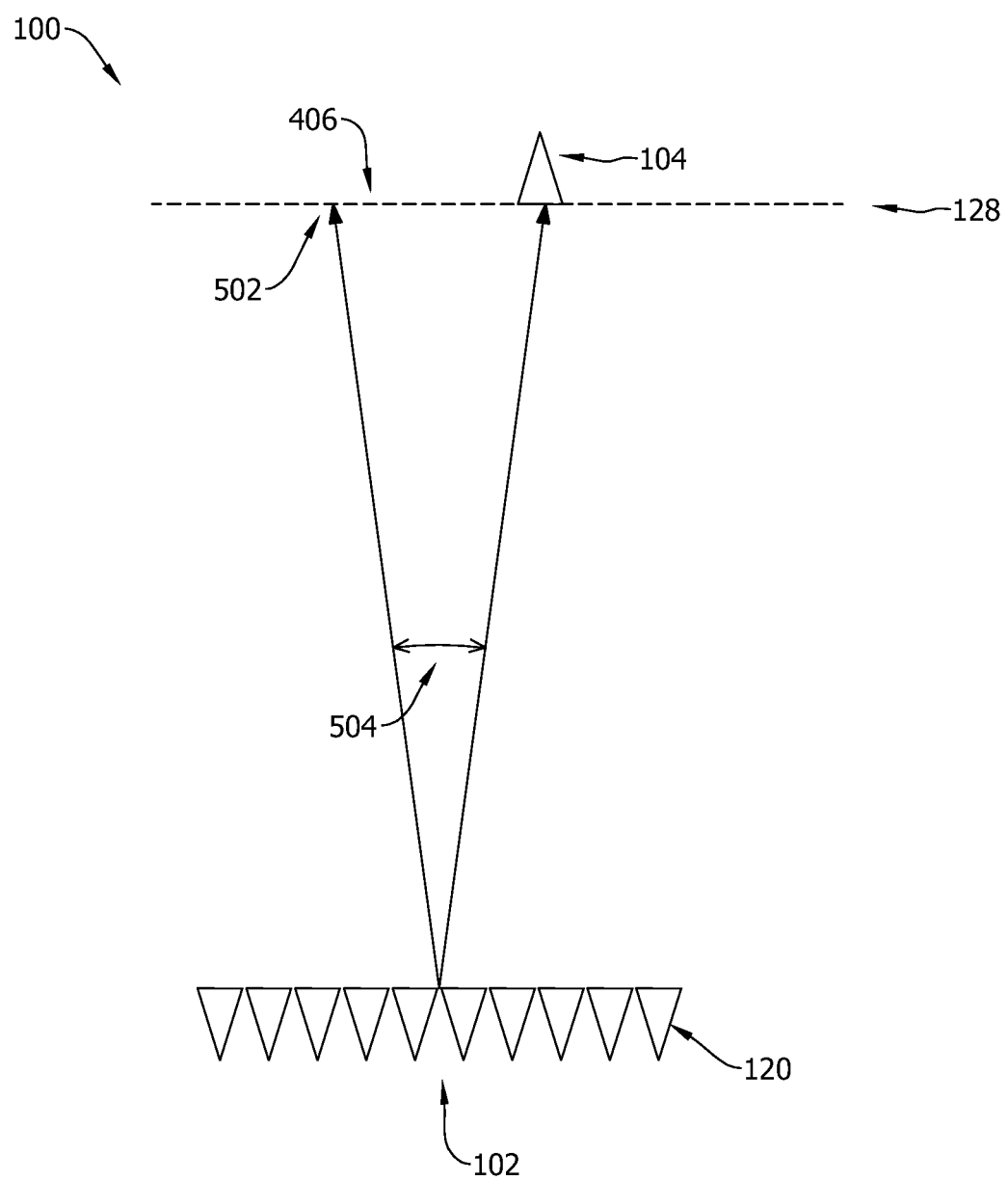
FIG. 5 is a diagram of the near-field test system shown in FIGS. 1 and 2.

Referring to FIG. 2 and FIG. 4, probe 104 is configured to receive, at its fixed position, at least a portion of beams 122, 124, 126 radiated from phased array antenna 102. Because each of beams 122, 124, 126 is pointed to a corresponding rastor position in near-field 128, the main lobe of each beam, e.g., main beam 408, is not necessarily received by probe 104. Rather, depending on the pointing angle in azimuth and/or elevation relative to the pointing angle of the fixed position of probe 104, probe 104 may receive main beam 408 or one of side lobes 410. FIG. 5 is a diagram of near-field test system 100 illustrating main beam 408 steered to a rastor position 502 in near-field 128. Rastor position 502 is defined in degrees azimuth and elevation, or pointing angles, one of which is illustrated in FIG. 5 as pointing angle 504 defined relative to the position of probe 104 in near-field 128. Accordingly, the power received at probe 104 is a function of pointing angle 504, as shown on antenna pattern 402 in FIG. 4. Likewise, given a received power at probe 104 and a known pointing angle 504, or a known rastor position 502, the received power can be normalized and mapped to a far-field antenna pattern. In alternative embodiments, the received power can be scaled to produce a far-field antenna pattern by referencing received power to a gain standard determined based on a power measurement at a same distance as the far-field.

Figure 6:
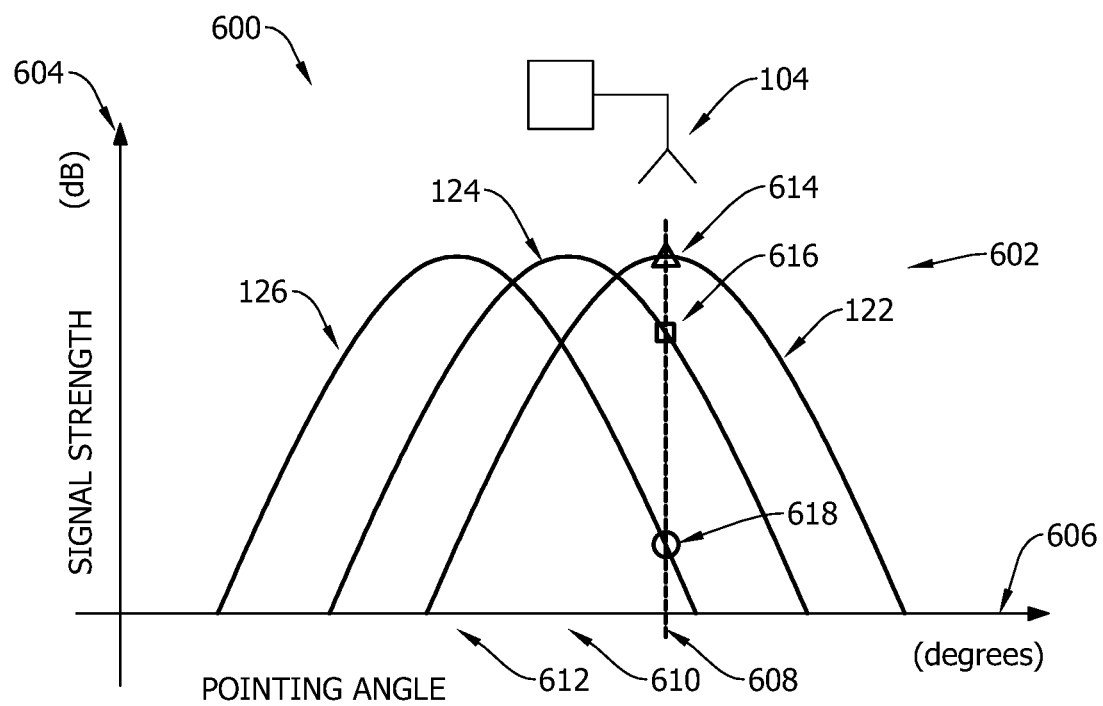
FIG. 6 is a plot of an example wave front produced by the phased array antenna shown in FIG. 1.

FIG. 6 is a plot 600 of a wave front 602 directed at probe 104. Wave front 602 is shown in power, expressed in decibels on a vertical axis 604, versus pointing angle, expressed in degrees on a horizontal axis 606. Wave front 602 includes, for example, beams 122, 124, and 126 shown in FIG. 2, each of which is aimed at a different pointing angle 608, 610, and 612, respectively. Beam 122 is aimed at probe 104 and, accordingly, is referred to as having a pointing angle 608 of zero. Beams 124 and 126 have pointing angles 610 and 612 that are non-zero relative to the pointing angle of beam 122, or are offset from probe 104. Consequently, the power received by probe 104 from beams 124 and 126 is reduced from that of beam 122, and can be expressed as a function of pointing angle. Because each of beams 122, 124, and 126 includes unique features, e.g., frequency, time, or coding, the power received at probe 104 can be divided among its components corresponding to those features. For example, probe 104 detects beam 122 with the greatest power, represented by a point 614 (illustrated as a triangle). Probe 104 detects beam 124, aimed at pointing angle 610, with a lesser power represented by a point 616 (illustrated as a square), and beam 126, aimed at pointing angle 612, with an even lesser power represented by a point 618 (illustrated as a circle).

Figure 7:
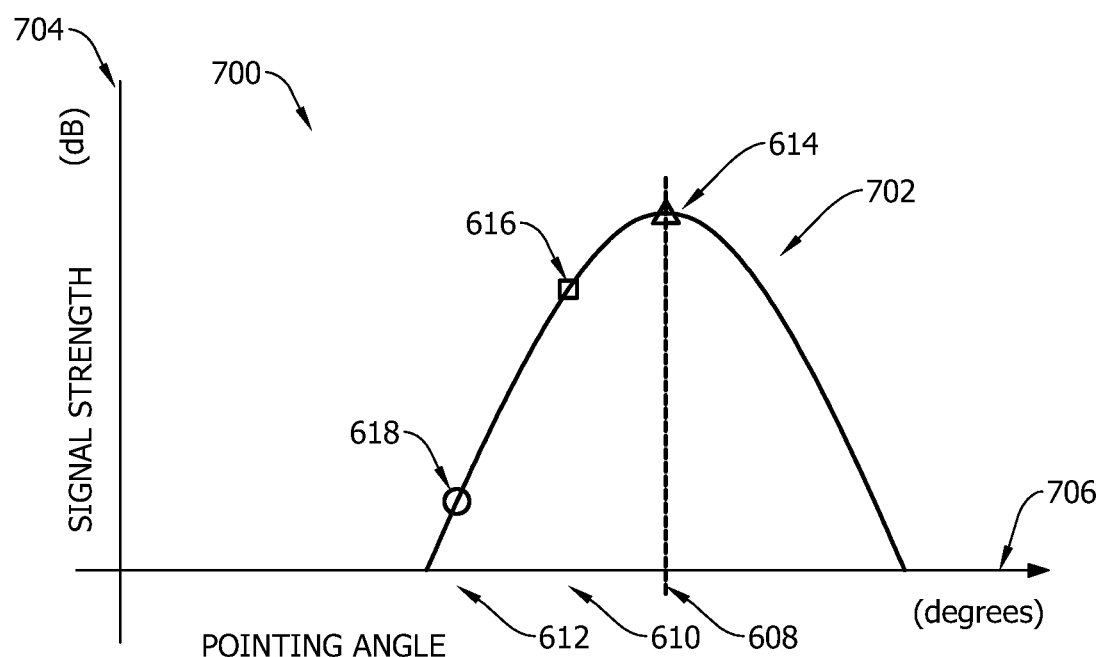
FIG. 7 is a plot of an example virtual antenna pattern measured by the near-field test system shown in FIGS. 1 and 2.

FIG. 7 is a plot 700 of a virtual antenna pattern 702 derived from power received at probe 104 from beams 122, 124, and 126. Virtual antenna pattern 702 is shown in power, expressed in decibels on a vertical axis 704, versus pointing angle, expressed in degrees on a horizontal axis 706. More specifically, normalized power levels corresponding to points 614, 616, and 618 are plotted against their respective pointing angles 608, 610, and 612 to produce virtual antenna pattern 702. Virtual antenna pattern 702 may also be referred to as a "snapshot" of the actual antenna pattern, which can be compared to an expected antenna pattern for the purpose of validating, for example, phased antenna array 102 and beam forming network 108.

FIGS. 6 and 7 illustrate three beams for clarity only. Concepts illustrated in FIGS. 6 and 7 apply equally for any number of beams and for any number of antenna elements 120 in phased array antenna 102.

Figure 8:
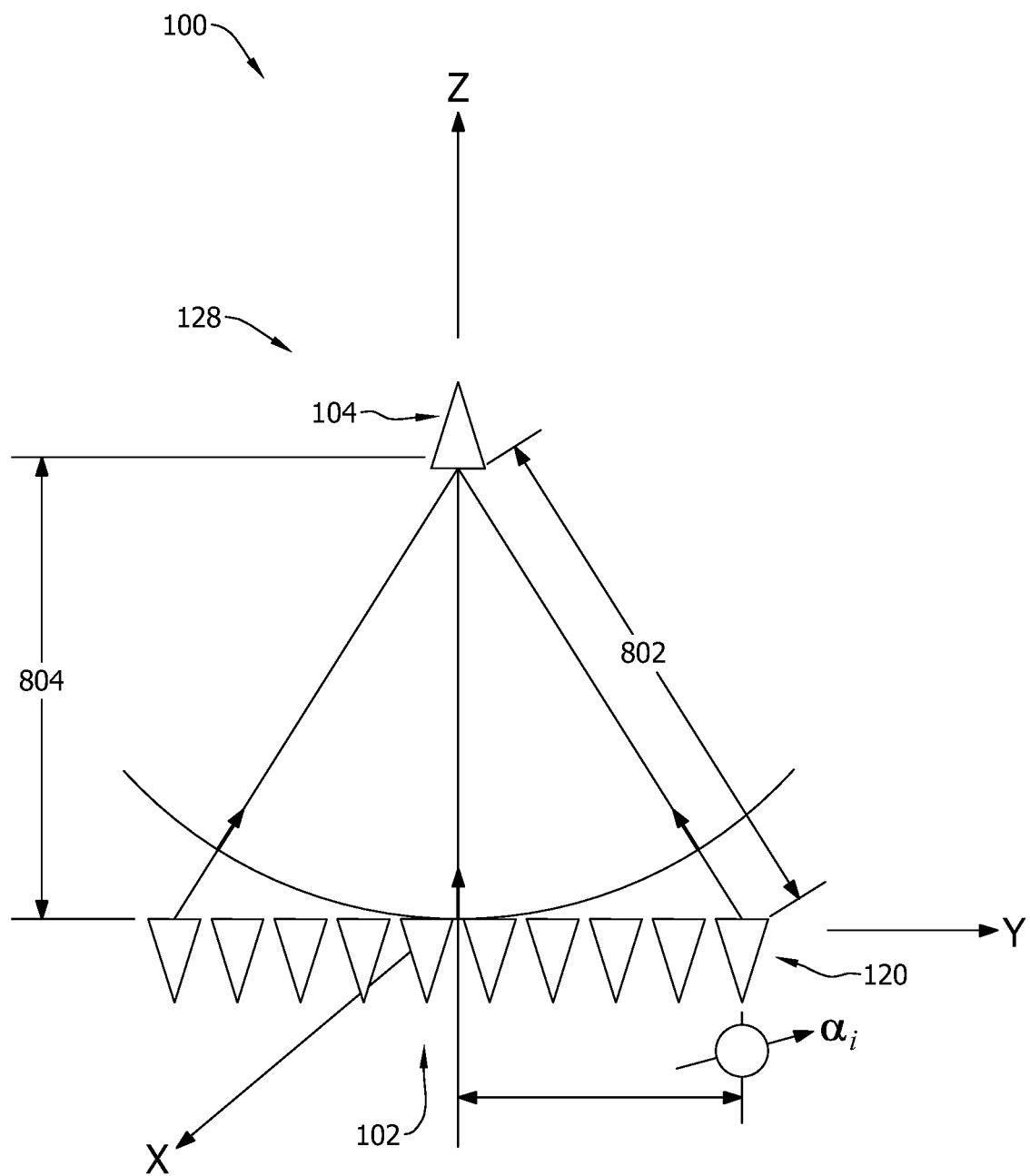
FIG. 8 is a diagram of the near-field test system shown in FIGS. 1 and 2 illustrating an example spherical phase taper.

FIG. 8 is a diagram of near-field test system 100 illustrating a spherical phase taper applied to antenna elements 120 of phased array antenna 102. For a given antenna element 120, a path length 802 from the antenna element to probe 104 is a function of a probe distance 804, D, or the distance from the center of the array of antenna elements 120 and probe 104, and a distance 806, $d_i$, of the $i^{th}$ antenna element 120 from the center of the array. More specifically, path length 802 is represented by $$\sqrt{D^2 + d_i^2}.$$

Generally, the further a given antenna element 120 is from the center of the array, the longer its path length 802. A longer path 802 manifests as a negative phase shift in the signal received at probe 104. A spherical phase taper applied to the phase shifter 304 for each antenna element 120 focuses the energy at probe 104 by applying a positive phase shift as a function of the relative position of a given antenna element 120. For example, a phase offset for the ith antenna element 120, $\propto_i$, is computed according to the following equation:

$$\propto_i = \frac{2\pi}{\lambda}\left(\sqrt{D^2 + d_i^2} - D\right)$$

where, $\lambda$ is the wavelength of the beam.

Figure 9:
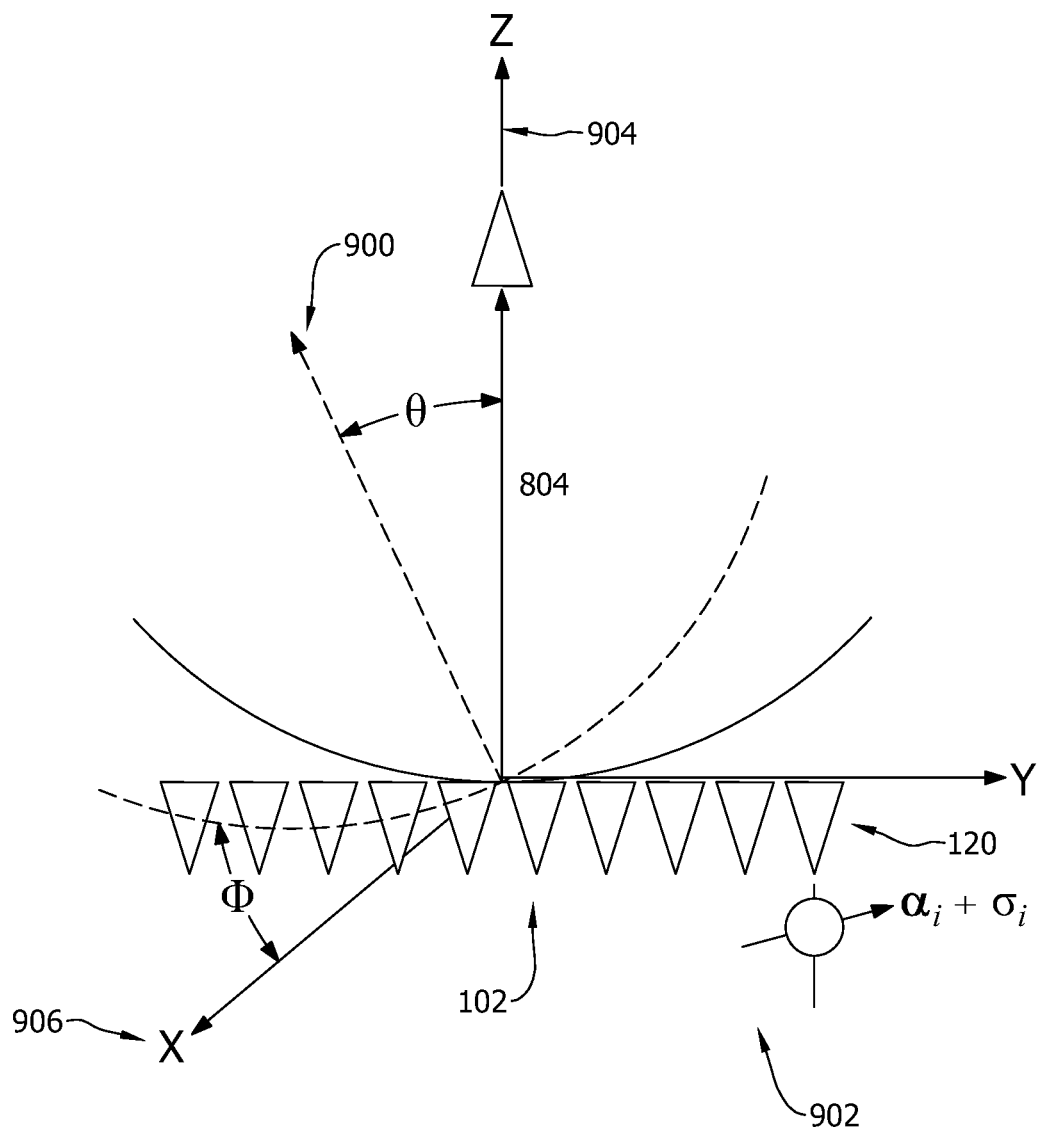
FIG. 9 is a diagram of the near-field test system shown in FIGS. 1 and 2 illustrating an example linear phase progression.

FIG. 9 is a diagram of near-field test system 100 illustrating a linear phase progression applied to antenna elements 120 of phased array antenna 102 to steer a radiated beam 900 to a pointing position in the near-field by directing the generated wave front by a given pointing angle, or scan angle. Near-field test system 100 is located in a Cartesian reference frame where phased array antenna 102 lies in an X-Y plane 902 and probe 104 is positioned in the near-field at probe distance 804 along a Z-axis 904. Accordingly, a given antenna element 120, or the $i^{th}$ antenna element 120, is positioned at an x-y coordinate $(x_i, y_j)$. The pointing angle for a given beam, generally expressed in azimuth and elevation angles, is translated to a polar coordinate system expressed as an angle, $\theta$, defined between beam 900 and Z-axis 904, and an angle, $\Phi$, defined as an angle of rotation about Z-axis 904, relative to an X-axis, of a projection of beam 900 onto X-Y plane 902. The linear phase progression yields a phase shift, $\sigma_i$, to be added to spherical phase taper, $\propto_i$, and applied by an $i^{th}$ phase shifter 304 for the $i^{th}$ antenna element 120 for beam 900. The linear phase progression is computed according to the following equation:

$$\sigma_i = \frac{-2\pi}{\lambda}(x_i \cdot \sin\theta\cos\Phi + y_i \cdot \sin\theta\sin\Phi).$$

Figure 10:
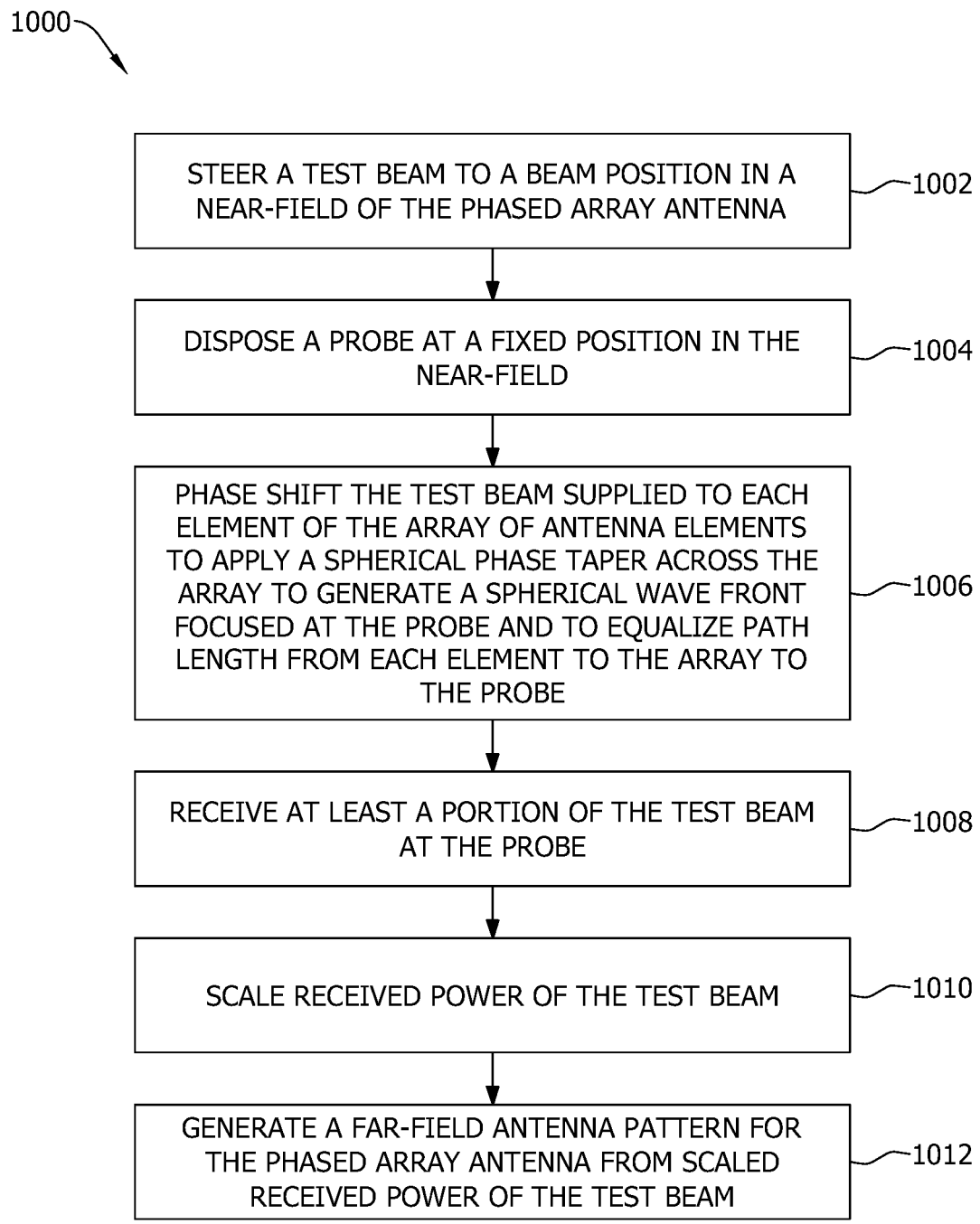
FIG. 10 is a flow diagram of an example method of near-field testing of a phased array antenna, such as the phased array antenna shown in FIGS. 1 and 2.

FIG. 10 is a flow diagram of a method 1000 of near-field testing of a phased array antenna, such as phased array antenna 102 shown in FIGS. 1 and 2, having an array of antenna elements 120. Method 1000 includes steering 1002 test beam 408 to beam position 502 in near-field 128 of phased array antenna 102. Test beam 408 is steered by applying a phase shift at phase shifters 304 corresponding to the test beam, where each phase shifter 304 also corresponds to an antenna element 120 in phased array antenna 102. More specifically, the phase shift may be applied as a linear phase progression as a function of beam position 502 and the position of a given antenna element 120 relative to the center of the array of phased array antenna 102.

Method 1000 further includes disposing 1004 probe 104 at a fixed position in near-field 128. In certain embodiments, method 1000 may further include moving probe 104 to a second fixed position in near-field 128 to capture a second "snapshot" far-field antenna pattern.

Method 1000 includes phase shifting 1006 test beam 408 supplied to each antenna element 120 of phased array antenna 102 to apply a spherical phase taper across the array. The spherical phase taper is added to the phase shift applied to steer 1002 test beam 408. The spherical phase taper forms the wave front radiated by phased array antenna 102 into a spherical wave front focused at the fixed position of probe 104. The spherical phase taper equalizes the path length phase from each antenna element 120 of the array to probe 104.

Method 1000 includes receiving 1008 at least a portion of test beam 408 at probe 104. Test probe 104 receives at least some power from either a main lobe of beam 408 or from one of side lobes 410. The received power is normalized 1010 based on beam position 502 relative to the fixed position of probe 104. The far-field antenna pattern for phased array antenna 102 is generated 1012 from the normalized received power of test beam 408.

Figure 11:
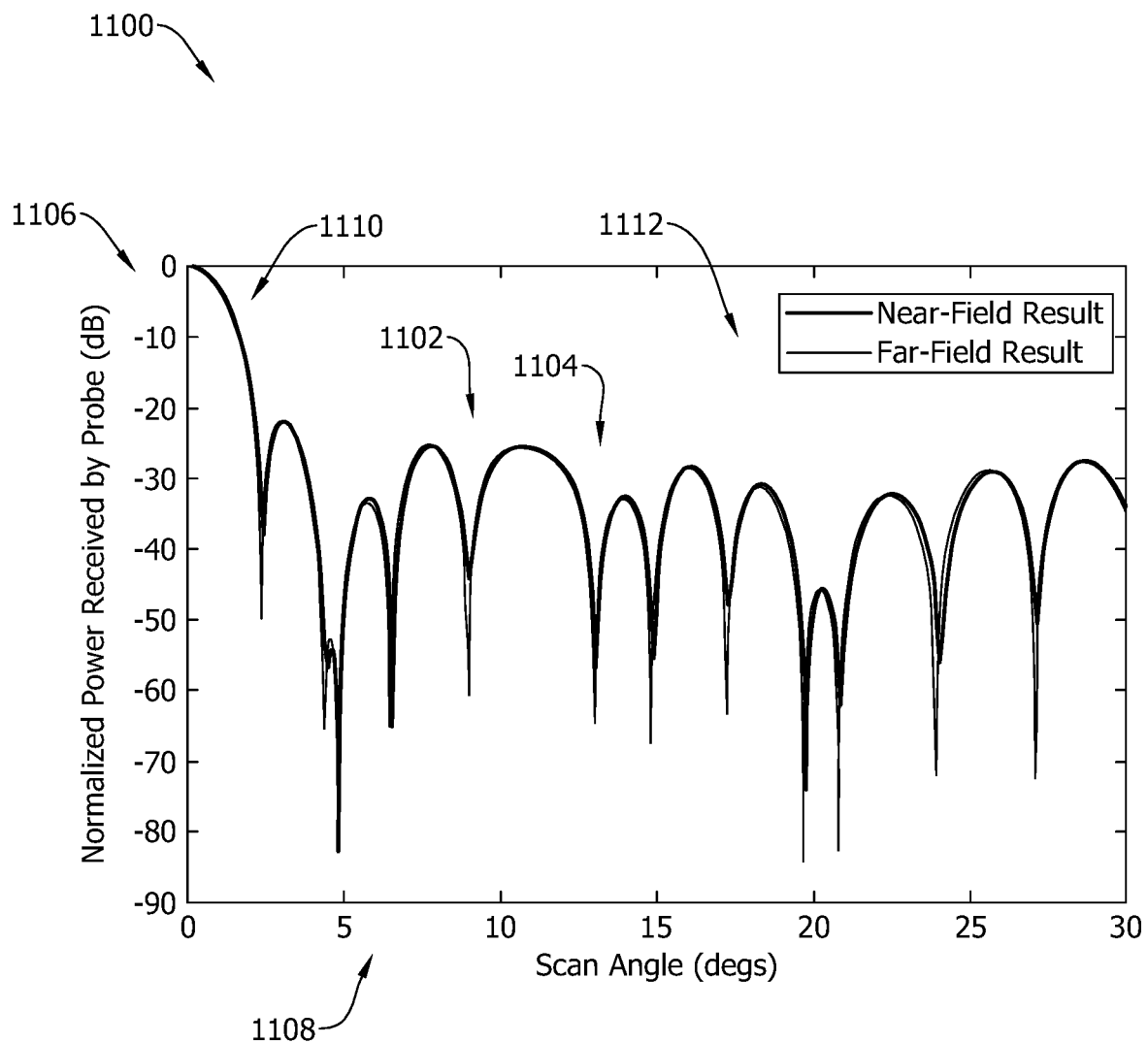
FIG. 11 is a graph of an example normalized received power measured by the near-field testing system shown in FIGS. 1 and 2, and a corresponding far-field antenna pattern.

FIG. 11 is a graph 1100 of an example normalized received power 1102, or virtual antenna pattern, measured by near-field testing system such as near-field testing system 100 shown in FIGS. 1 and 2, and a corresponding far-field antenna pattern 1104, expressed in power, measured in the far-field for reference. Power is represented on a vertical axis 1106 and expressed in dB relative to a main beam power. Power is plotted versus scan angle shown on a horizontal axis 1108 and expressed in degrees relative to boresight. Generally, normalized received power 1102 matches the far-field antenna pattern 1104, thereby validating near-field testing system 100. The far-field antenna pattern 1104 features a main lobe 1110 and a plurality of side lobes 1112.

Figure 12:
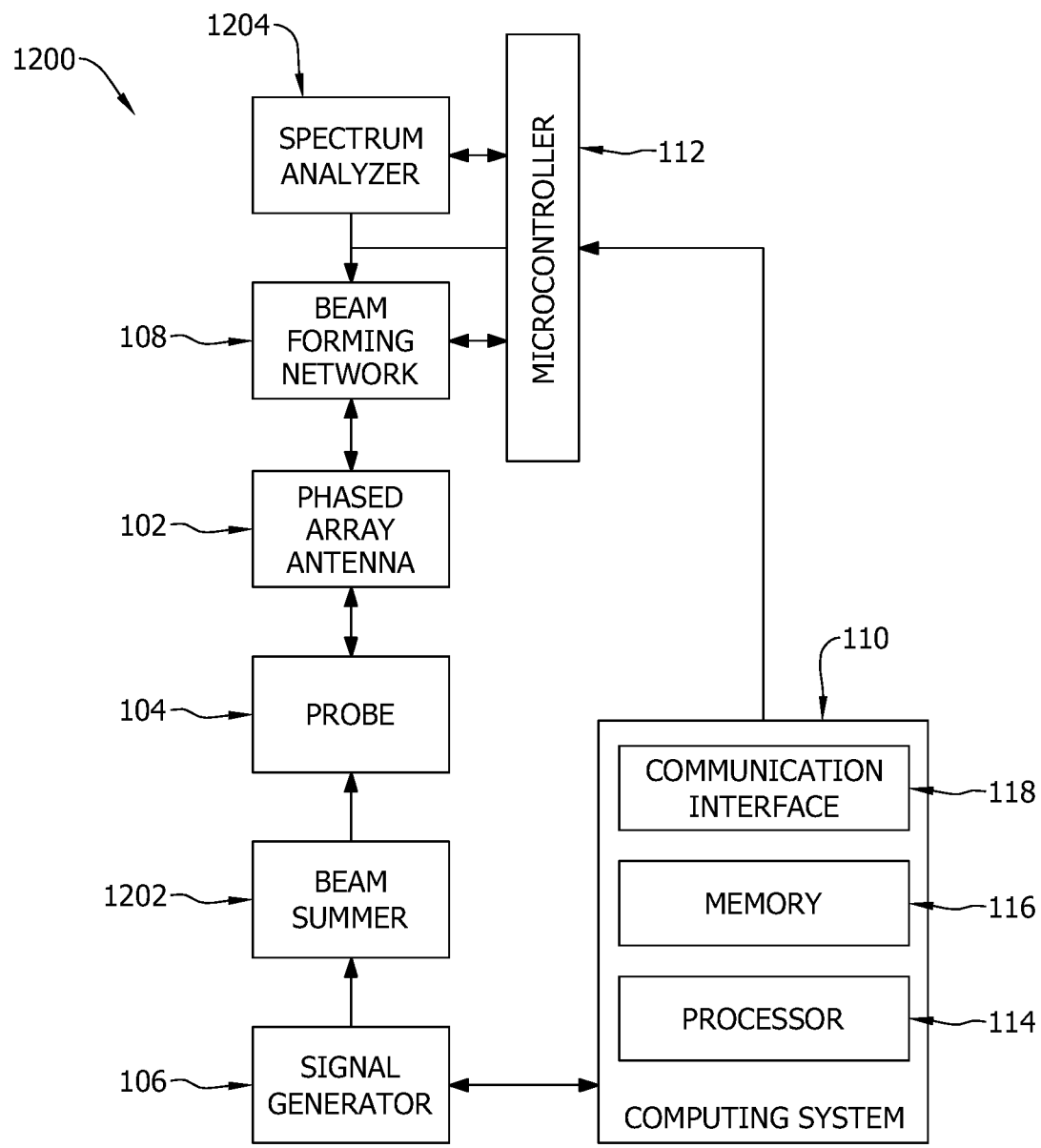
FIG. 12 is a block diagram of an example near-field test system for a receiving phased array antenna.

FIG. 12 is a block diagram of an example near-field test system 1200 for phased array antenna 102. Near-field test system 1200 is similar to near-field test system 100 shown in FIG. 1, in that both can effectively test phased array antenna 102, for example, for the purpose of validating far-field antenna patterns. However, where near-field test system 100 is configured to transmit one or more test beams from phased array antenna 102 toward probe 104 positioned in the near-field 128, near-field test system 1200 is configured to transmit one or more test beams from probe 104 toward phased array antenna 102. Accordingly, certain elements of near-field test system 100 are also used in near-field test system 1200, and certain other elements of near-field test system 1200 are at least not shown in near-field test system 100 as illustrated, for example, in FIG. 1, or vice-versa.

Figure 13:
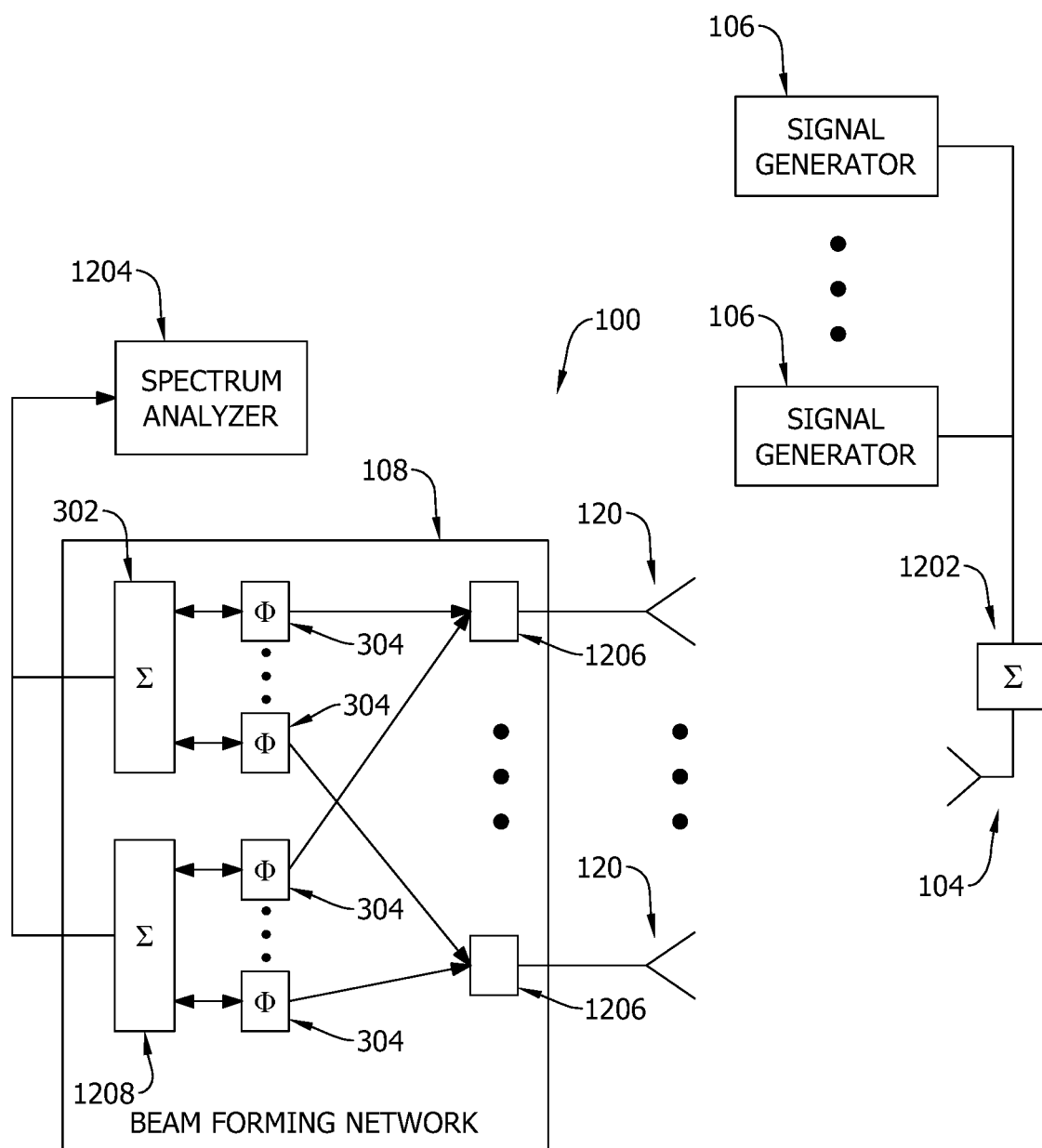
FIG. 13 is a block diagram of the near-field test system and beam forming network shown in FIG. 12.

Near-field test system 1200 includes computing system 110, microcontroller 112, phased array antenna 102, and probe 104 positioned in the near-field 128. Phased array antenna 102 is coupled to beam forming network 108, which will process received signals from phased array antenna 102 in a functionally-reversed sequence as compared, for example, to the description of beam forming network 108 shown in FIG. 3. FIG. 13 is a block diagram of near-field test system 1200 and beam forming network 108 shown in FIG. 12. In certain embodiments, for example, embodiments of beam forming network 108 using analog components, the same components of beam forming network 108 process both transmitted and received signals. However, in alternative embodiments, for example, certain embodiments of beam forming network 108 that use digital components, the transmit and receive paths through beam forming network 108 are distinct.

Generally, probe 104 transmits a test beam composed of multiple signals generated by signal generators 106. Computing system 110 controls signal generators 106 to generate each signal with a unique feature, such as frequency, time, or coding. The signals are then combined by a beam summer 1202 before being emitted by probe 104. As in near-field test system 100 shown in FIG. 1, the test beam is aimed at a fixed location, however, each antenna element 120 of phased array antenna 102 receives varying levels of power from each of the test beams components and, more specifically, reduced power as the position of a given receiving antenna element 120 moves away from the fixed location at which the test beam is aimed. For example, if the test beam is aimed at a central antenna element, power received at antenna elements 120 on the perimeter of phased array antenna 102 will generally receive less power than the interior antenna elements.

The test beam is received at antenna elements 120 and is directed into beam forming network 108. In the functionally-reversed use case (i.e., receiving), beam forming network 108 produces a spectrum, or "virtual spectrum," of signals corresponding to the original signals generated by signal generators 106 and having the corresponding unique features. The spectrum can be recorded as data in memory or, for example, can be viewed on computing system 110 or another computing system, such as a spectrum analyzer 1204.

Beam forming network 108, as stated above, may include common components for both the receive path and transmit path, or may include distinct components for the receive path and transmit path. FIG. 13 illustrates beam forming network 108 functionally, and thus certain components are illustrated as distinct from those shown in FIG. 3. However, the functional aspects of certain components shown distinctly in FIGS. 3 and 13 may be combined into a single device in certain implementations. For example, beam forming network 108, as shown in FIG. 13, includes beam dividers 1206 that separate a beam received by a given antenna element 120 into its components by their respective unique features, e.g., by frequency, timing, or coding. Conversely, beam forming network 108, as shown in FIG. 3, includes beam summers 306 that combine phase shifted beams into a single beam for emitting from a given antenna element 120. In certain embodiments, beam summers 306 and beam dividers 1206 may be implemented by a single bidirectional component that performs the summing and dividing functions appropriately for transmitted and received signals, respectively. In alternative embodiments, beam summers 306 and beam dividers 1206 may be implemented as distinct components, each residing appropriately on the transmit path or the receive path of beam forming network 108.

As described above, for a given antenna element 120, a received beam is divided by beam dividers 1206 into its component signals based on their respective unique features. The component signals then pass through phase shifters 304 (also shown in FIG. 3). Phase shifters 304 adjust the phase of each signal to "steer" the beam. The original test beam radiated by probe 104 was aimed at the fixed location, however each antenna element 120 detects a distinct beam in phase and amplitude based on its position on phased array antenna 102. Consequently, the signals that pass to phase shifters 304 are skewed in phase (and amplitude) from the original test beam. Thus, phase shifters adjust the phase of each signal to correct for that "steering" introduced by antenna elements 120. Phase shifters 304 apply the same phase progressions and, in certain embodiments, spherical phase taper as in the transmit use case described above and shown in FIG. 3. Phase shifters 304 yield a plurality of signals that form a generally planar wave front.

Beam forming network 108 includes a plurality of beam summers 1208, generally one for each unique feature, i.e., each signal, generated by signal generators 106. Beam summers 1208 combine phase shifted signals from each antenna element 120 for a corresponding one of the unique features of the signals generated by signal generators 106. For example, if the original test beam emitted by probe 104 is a composite of six signals generated by signal generators 106, each having a unique frequency, all six signals are received at each antenna element 120 and divided into the six components by beam dividers 1206. The six components from each antenna element 120 are then phase shifted appropriately for that antenna element 120, and combined into six signals by beam summers 1208. Accordingly, in this example, a virtual spectrum having six frequency components may be shown on spectrum analyzer 1204.

Figure 14:
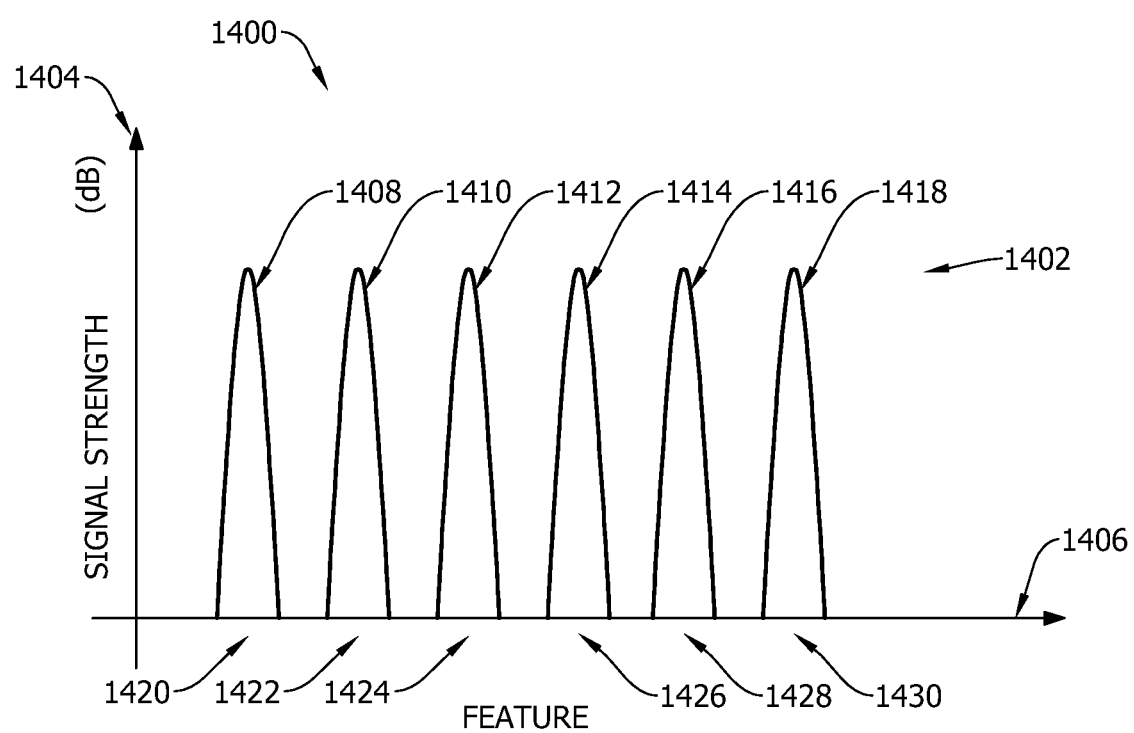
FIG. 14 is a plot of an example virtual spectrum measured by the near-field test system shown in FIGS. 12 and 13.

FIG. 14 is a plot 1400 of an example virtual spectrum 1402, or "snapshot," measured by near-field test system 1200 shown in FIGS. 12 and 13, and derived from a test beam radiated by probe 104 at phased array antenna 102. Virtual spectrum 1402 is shown in power, expressed in decibels on a vertical axis 1404, versus feature (e.g., frequency, timing, code) on a horizontal axis 1406. In the example described above, signal generators 106 produce six signals, each having a unique frequency. Accordingly, for that example, virtual spectrum 1402 includes six signals 1408, 1410, 1412, 1414, 1416, and 1418 having distinct frequencies as their respective unique features 1420, 1422, 1424, 1426, 1428, and 1430. Virtual spectrum 1402 may be displayed, for example, on spectrum analyzer 1204.

FIG. 14 illustrates six signals for clarity only. Concepts illustrated and described with respect to FIGS. 12-14 apply equally for any number of signals and for any number of antenna elements 120 in phased array antenna 102.

Figure 15:
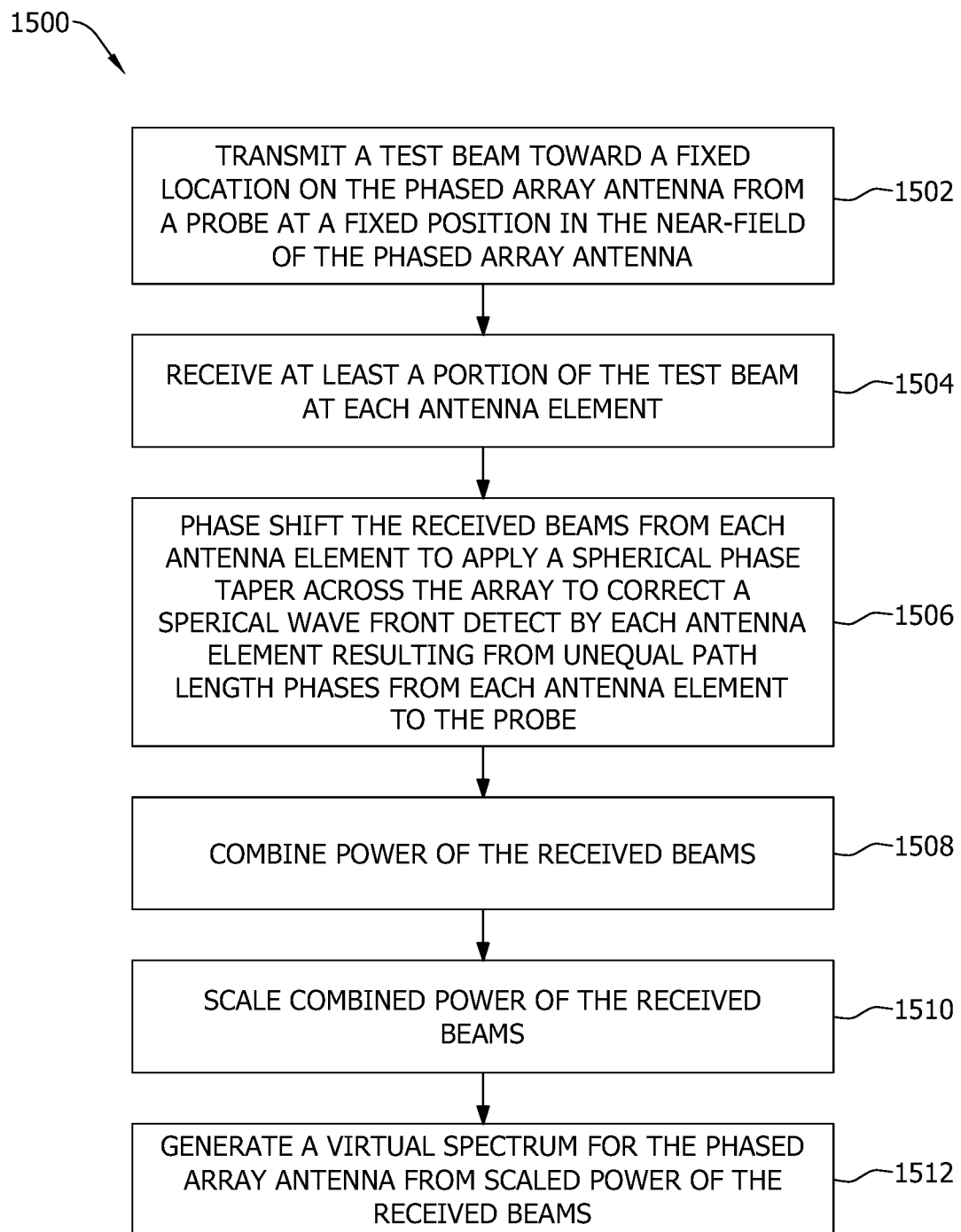
FIG. 15 is a flow diagram of an example method of near-field testing of a phased array antenna, such as the phased array antenna shown in FIGS. 12 and 13.

FIG. 15 is a flow diagram of an example method 1500 of near-field testing of a phased array antenna, such as the phased array antenna 102 shown in FIGS. 12 and 13. Method 1500 begins with transmitting 1502 a test beam toward a fixed location on phased array antenna 102 from probe 104 at a fixed position in the near-field 128 of the phased array antenna 102. In certain embodiments, probe 104 is coupled with a plurality of signal generators 106 and a beam summer 1202. In such embodiments, each of the plurality of signal generators 106 produces a test signal having a unique feature, such as, for example, a unique frequency, a unique timing, or a unique coding. The plurality of test signals is then combined by beam summer 1202 into the test beam.

At least a portion of the test beam is received 1504 at each antenna element 120. The received beams from each antenna element 120 are phase shifted 1506 to apply a spherical phase taper across the array to correct a spherical wave front detected by each antenna element 120 resulting from unequal path length phases from each antenna element 120 to probe 104, thereby producing a planar wave front. The power of the received beams is combined 1508 by a beam summer 1208.

In embodiments where multiple test signals are combined into the test beam, received beams from each antenna element 120 are separated by beam dividers 1206 into components according to the unique features of the test signals. For example, where the unique features of each test signal are unique frequencies, beam dividers 1206 separate received beams into frequency components, each received component being passed along to a different set of phase shifters 304. Powers of the received components from each antenna element 120 are then combined by beam summers 1208 after phase shifting 1506. Combined power is scaled 1510 and used to generate 1512 a virtual spectrum for the phased array antenna.

The technical effects of embodiments of the systems and methods described herein include, for example: (a) providing a near-field testing system with a single probe disposed at a fixed position in the near-field; (b) reducing the time, expense, and complexity of near-field testing by using a fixed probe position rather than mechanically scanning the probe over the face of the antenna under test; (c) electronically scanning multiple beams over a grid of rastor positions in the near-field to capture a single "snapshot" of the near-field power; (d) generating a far-field antenna pattern from near-field received power from the multiple beams normalized for each beam's rastor position relative to the fixed position of the probe; (e) generating a far-field antenna pattern without phase and amplitude measurements for each beam and without rastor scanning over the face of the array; (f) generating a far-field antenna pattern without two-dimensional Fourier transform to translate the near-field characterization to the far-field; and (g) applying a spherical phase taper over the antenna elements to generate a spherical wave front focused on the probe at the fixed position.

Some embodiments involve the use of one or more electronic processing or computing devices. As used herein, the terms "processor" and "computer" and related terms, e.g., "processing device," "computing device," and "controller" are not limited to just those integrated circuits referred to in the art as a computer, but broadly refers to a processor, a processing device, a controller, a general purpose central processing unit (CPU), a graphics processing unit (GPU), a microcontroller, a microcomputer, a programmable logic controller (PLC), a reduced instruction set computer (RISC) processor, a field programmable gate array (FPGA), a digital signal processing (DSP) device, an application specific integrated circuit (ASIC), and other programmable circuits or processing devices capable of executing the functions described herein, and these terms are used interchangeably herein. The above embodiments are examples only, and thus are not intended to limit in any way the definition or meaning of the terms processor, processing device, and related terms.

In the embodiments described herein, memory may include, but is not limited to, a non-transitory computer-readable medium, such as flash memory, a random access memory (RAM), read-only memory (ROM), erasable programmable read-only memory (EPROM), electrically erasable programmable read-only memory (EEPROM), and non-volatile RAM (NVRAM). As used herein, the term "non-transitory computer-readable media" is intended to be representative of any tangible, computer-readable media, including, without limitation, non-transitory computer storage devices, including, without limitation, volatile and non-volatile media, and removable and non-removable media such as a firmware, physical and virtual storage, CD-ROMs, DVDs, and any other digital source such as a network or the Internet, as well as yet to be developed digital means, with the sole exception being a transitory, propagating signal. Alternatively, a floppy disk, a compact disc-read only memory (CD-ROM), a magneto-optical disk (MOD), a digital versatile disc (DVD), or any other computer-based device implemented in any method or technology for short-term and long-term storage of information, such as, computer-readable instructions, data structures, program modules and sub-modules, or other data may also be used. Therefore, the methods described herein may be encoded as executable instructions, e.g., "software" and "firmware," embodied in a non-transitory computer-readable medium. Further, as used herein, the terms "software" and "firmware" are interchangeable, and include any computer program stored in memory for execution by personal computers, workstations, clients and servers. Such instructions, when executed by a processor, cause the processor to perform at least a portion of the methods described herein. The systems and methods described herein are not limited to the specific embodiments described herein, but rather, components of the systems and/or steps of the methods may be utilized independently and separately from other components and/or steps described herein.

The systems and methods described herein are not limited to the specific embodiments described herein, but rather, components of the systems and/or steps of the methods may be utilized independently and separately from other components and/or steps described herein.

For example embodiments of the systems and methods may include:

A near-field test system for a phased array antenna, the near-field test system comprising: a probe disposed at a fixed position in a near-field of the phased array antenna and configured to receive at least a portion of a test beam radiated by the phased array antenna; a beam forming network coupled to the phased array antenna and comprising a plurality of phase shifters configured to steer the test beam to a position in the near-field when radiated by an array of antenna elements of the phased array antenna; and a computing system coupled to the probe and configured to: scale received power of the test beam; and generate a far-field antenna pattern for the phased array antenna from scaled received power of the test beam.

The near-field test system above, wherein the computing system is further configured to normalize received power of the test beam based on the position of the beam in the near-field relative to the fixed position of the probe.

Any of the near-field test systems above, wherein the beam forming network further comprises: a plurality of phase shifters for each of a plurality of test beams, the plurality of test beams each having a unique feature, the plurality of phase shifters configured to steer the plurality of test beams to corresponding rastor positions in the near-field when radiated by the phased array antenna; and a plurality of beam summers corresponding to the array of antenna elements of the phased array antenna, the plurality of beam summers configured to combine the plurality of test beams to be radiated by each element of the array of antenna elements; and wherein the computing system is further configured to: normalize received power of each beam of the plurality of test beams based on the corresponding rastor position determined based on the unique feature of the beam, and generate the far-field antenna pattern for the phased array antenna from normalized received powers of the plurality of test beams.

Any of the near-field test systems above, wherein the plurality of phase shifters for each of the plurality of test beams is configured to apply a spherical phase taper across the array of antenna elements to generate a spherical wave front focused at the probe and equalize path length phase from each element of the array to the probe.

Any of the near-field test systems above, further comprising a plurality of signal generators coupled to the beam forming network and corresponding to the plurality of test beams, wherein each signal generator is configured to supply a beam signal having the unique feature to the plurality of phase shifters for a corresponding test beam.

Any of the near-field test systems above, wherein each of the plurality of signal generators is configured to generate the beam signal having a unique feature selected from the group consisting of: a unique frequency, a unique timing, and a unique code.

Any of the near-field test systems above, wherein the plurality of phase shifters is further configured to apply a linear phase progression across the array of antenna elements based on a distance from a center of the array to each element of the array to steer the plurality of test beams to the corresponding rastor positions.

A method, comprising: steering a test beam to a beam position in a near-field of a phased array antenna; disposing a probe at a fixed position in the near-field of the phased array antenna; phase shifting the test beam supplied to each element of an array of antenna elements of the phased array antenna to apply a spherical phase taper across the array to generate a spherical wave front focused at the probe and to equalize path length phase from each element of the array to the probe; receiving at least a portion of the test beam at the probe; scaling received power of the test beam; and generating a far-field antenna pattern for the phased array antenna from normalized received power of the test beam.

The method above, further comprising phase shifting the test beam to apply a linear phase progression across the array of antenna elements based on a distance from a center of the array to each element of the array to steer the test beam to the beam position.

Any of the methods above, further comprising: applying a linear phase progression to each of a plurality of test beams to steer the plurality of test beams to corresponding rastor positions in the near-field when radiated by the phased array antenna, the plurality of test beams each having a unique feature; summing the plurality of test beams for each element in the array of antenna elements; normalizing received power of each beam of the plurality of test beams based on the corresponding rastor position determined based on the unique feature of the beam; and generating the far-field antenna pattern for the phased array antenna from normalized received powers of the plurality of test beams.

Any of the methods above, further comprising generating a plurality of beam signals corresponding to the plurality of test beams having the unique feature, wherein the unique feature is selected from the group consisting of: a unique frequency, a unique timing, and a unique code.

Any of the methods above, further comprising comparing the far-field antenna pattern to an expected far-field antenna pattern to verify integrity of the phased array antenna and its beam forming network for all of the plurality of test beams.

Any of the methods above, further comprising: disposing the probe at a second fixed position in the near-field of the phased array antenna; and repeating the near-field testing of the phased array antenna to obtain signatures of at least one radiating property of the array of antenna elements.

Any of the methods above, wherein scaling comprises normalizing received power of the test beam based on the beam position relative to the fixed position of the probe.

A beam forming network for near-field testing of a phased array antenna, the beam forming network comprising: a plurality of phase shifters coupled to a signal generator, each configured to: receive a test beam from the signal generator, apply a corresponding phase shift to the test beam, and supply the test beam to an element of an array of antenna elements of the phased array antenna; and a microcontroller coupled to the plurality of phase shifters for controlling the corresponding phase shift of each element of the array, the microcontroller configured to: adjust the corresponding phase shift of each element to steer the test beam to a position in the near-field of the phased array antenna when radiated by the array, adjust the corresponding phase shift of each element to apply a spherical phase taper across the array to generate a spherical wave front focused at a probe disposed in the near-field of the phased array antenna and to equalize path length phase from each element of the array to the probe when the test beam is radiated by the array.

The beam forming network above, wherein the microcontroller is further configured to adjust the corresponding phase shift of each element to apply a linear phase progression across the array of antenna elements based on a distance from a center of the array to each element of the array to steer the test beam to the position in the near-field.

Any of the beam forming networks above, further comprising a plurality of beam summers corresponding to the array of antenna elements of the phased array antenna, the plurality of beam summers configured to combine a plurality of test beams to be radiated by each element of the array of antenna elements.

Any of the beam forming networks above, further comprising a plurality of phase shifters for each of the plurality of test beams, the plurality of test beams each having a unique feature, the plurality of phase shifters further configured to steer the plurality of test beams to corresponding rastor positions in the near-field when radiated by the phased array antenna.

Any of the beam forming networks above, wherein the microcontroller is further configured to be coupled to a computing system over a communication channel, wherein the computing system is coupled to the probe, and wherein the microcontroller is further configured to communicate the rastor positions of the plurality of test beams and the unique feature of each of the plurality of test beams to the computing system over the communication channel.

Any of the beam forming networks above, wherein the microcontroller is further configured to be coupled to a computing system over a communication channel, wherein the computing system is coupled to the probe, and wherein the microcontroller is further configured to communicate the position of the beam to the computing system over the communication channel.

A near-field test system for a phased array antenna, the near-field test system comprising: a probe disposed at a fixed position in a near-field of the phased array antenna and configured to transmit a test beam toward a fixed location on the phased array antenna; a beam forming network coupled to the phased array antenna and comprising: a plurality of phase shifters configured to steer received beams for each antenna element of the phased array antenna to form a planar wave front when radiated by the probe; and a beam summer coupled to the plurality of phase shifters and configured to combine power of the received beams; a computing system coupled to the beam forming network and configured to: scale combined power of the received beams; and generate a virtual spectrum for the phased array antenna from scaled power of the received beams.

The near-field test system above, wherein the computing system is further configured to normalize combined power of the received beams based on positions of corresponding antenna elements for the received beams on the phased array antenna relative to the fixed location to which the test beam is directed.

Any of the near-field test systems above, further comprising: a plurality of signal generators configured to generate a corresponding plurality of test signals, the plurality of test signals each having a unique feature; and a beam summer coupled to the plurality of signal generators and the probe, the beam summer configured to combine the plurality test signals into the test beam.

Any of the near-field test systems above, wherein the beam forming network further comprises: a beam divider for each antenna element of the phased array antenna, each beam divider configured to separate a received beam into received components corresponding to the unique feature for each of the plurality of test signals; a plurality of phase shifters for each of the plurality of test signals, the plurality of phase shifters configured to steer the received components of the received beam to form the planar wave front; and a plurality of beam summers corresponding to the plurality of test signals, the plurality of beam summers configured to combine power of the received components for each of the plurality of test signals; wherein the computing system is further configured to: normalize combined power of received components for each of the received beams based on the position of corresponding antenna elements for the received beams on the phased array antenna relative to the fixed location to which the test beam is directed; and generate the virtual spectrum for the phased array antenna from normalized combined powers of the plurality of test signals.

Any of the near-field test systems above, wherein the plurality of phase shifters for each of the plurality of test signals is configured to apply a spherical phase taper across the array of antenna elements to correct a spherical wave front detected by each antenna element of the phased array antenna resulting from unequal path length phases from each antenna element to the probe.

Any of the near-field test systems above, wherein each of the plurality of signal generators is configured to generate the beam signal having a unique feature selected from the group consisting of: a unique frequency, a unique timing, and a unique code.

Any of the near-field test systems above, wherein the plurality of phase shifters is further configured to apply a linear phase progression across the array of antenna elements based on a distance from a center of the array to each element of the array to steer the received beams to form a planar wave front.

Any of the near-field test systems above, wherein the computing system comprises a spectrum analyzer configured to measure power of the received beams.

A method of near-field testing of a phased array antenna having an array of antenna elements, the method comprising: transmitting a test beam toward a fixed location on the phased array antenna from a probe at a fixed position in the near-field of the phased array antenna; receiving at least a portion of the test beam at each antenna element; phase shifting received beams from each antenna element to apply a spherical phase taper across the array to correct a spherical wave front detected by each antenna element resulting from unequal path length phases from each antenna element to the probe, thereby producing a planar wave front; combining power of the received beams; scaling combined power of the received beams; and generating a virtual spectrum for the phased array antenna from scaled power of the received beams.

The method above, further comprising phase shifting the received beams to apply a linear phase progression across the array of antenna elements based on a distance from a center of the array to each element of the array to steer the received beams to form a planar wave front.

Any of the methods above, further comprising: generating a plurality of test signals having unique features; and combining the plurality test signals into the test beam.

Any of the methods above, further comprising: dividing a received beam from each antenna element into received components corresponding to the unique feature for each of the plurality of test signals; applying a linear phase progression to the received beams to steer the received components of each received beam to form the planar wave front; and combining power of the received components from each antenna element for each of the plurality of test signals; normalizing combined power of received components for each of the received beams based on positions of corresponding antenna elements for the received beams on the phased array antenna relative to the fixed location to which the test beam is directed; and generating the virtual spectrum for the phased array antenna from normalized combined powers of the plurality of test signals.

Any of the methods above, wherein generating the plurality of test signals comprises generating the plurality of test signals having a unique feature selected from the group consisting of: a unique frequency, a unique timing, and a unique code.

Any of the methods above, further comprising comparing the virtual spectrum to an expected spectrum to verify integrity of the phased array antenna and its beam forming network for all of the plurality of test signals.

Any of the methods above, further comprising: disposing the probe at a second fixed position in the near-field of the phased array antenna; and repeating the near-field testing of the phased array antenna to obtain signatures of at least one receiving property of the array of antenna elements.

Any of the methods above, wherein scaling comprises normalizing combined power of the received beams based on positions of corresponding antenna elements for the received beams on the phased array antenna relative to the fixed location to which the test beam is directed.

A beam forming network for near-field testing of a phased array antenna, the beam forming network comprising: a plurality of phase shifters coupled to respective antenna elements of the phased array antenna, each phase shifter configured to: receive a received beam from the respective antenna element, apply a corresponding phase shift to the received beam, and supply the received beam to a beam summer; and a microcontroller coupled to the plurality of phase shifters for controlling the corresponding phase shift of each element of the array, the microcontroller configured to adjust the corresponding phase shift of each element to apply a spherical phase taper across the array to correct a spherical wave front detected by each antenna element resulting from unequal path length phases from each antenna element to a probe from which a test beam originated, thereby producing a planar wave front.

The beam forming network above, wherein the microcontroller is further configured to adjust the corresponding phase shift of each element to apply a linear phase progression across the array of antenna elements based on a distance from a center of the array to each element of the array to steer the received beams to form a planar wave front.

Any of the beam forming networks above, further comprising a plurality of beam dividers corresponding to the array of antenna elements of the phased array antenna, the plurality of beam summers configured to separate a received beam into received components corresponding to a unique feature for each of a plurality of test signals combined into a test beam received by the array of antenna elements.

Any of the beam forming networks above, further comprising a plurality of phase shifters for each of the plurality of test signals, the plurality of test signals each having a unique feature, the plurality of phase shifters further configured to steer the received components of the received beam to form the planar wave front.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

As used herein, an element or step recited in the singular and proceeded with the word "a" or "an" should be understood as not excluding plural elements or steps unless such exclusion is explicitly recited. Furthermore, references to "one embodiment" of the present disclosure or "an example embodiment" are not intended to be interpreted as excluding the existence of additional embodiments that also incorporate the recited features. To the extent the terms "includes," "including," "has," "contains," and variants thereof are used herein, such terms are intended to be inclusive in a manner similar to the term "comprises" as an open transition word without precluding any additional or other elements.

This written description uses examples to disclose various embodiments, which include the best mode, to enable any person skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A near-field test system for a phased array antenna, the near-field test system comprising:
    a single probe disposed at a single fixed position in a near-field of the phased array antenna and configured to transmit a single test beam toward a fixed location on the phased array antenna;
    a beam forming network coupled to the phased array antenna and comprising:
        a plurality of phase shifters configured to steer received beams for each antenna element of the phased array antenna to form a planar wave front when the received beams are combined; and
        a beam summer coupled to the plurality of phase shifters and configured to combine power of the received beams;
    a computing system coupled to the beam forming network and configured to:
        scale combined power of the received beams; and
        generate a virtual spectrum for the phased array antenna from scaled power of the received beams, wherein the received beams correspond entirely to the single test beam emitted from the single probe disposed at the single fixed position.

2. The near-field test system of claim 1, wherein the computing system is further configured to normalize combined power of the received beams based on positions of corresponding antenna elements for the received beams on the phased array antenna relative to the fixed location to which the single test beam is directed.

3. The near-field test system of claim 1 further comprising:
a plurality of signal generators configured to generate a corresponding plurality of test signals, the plurality of test signals each having a unique feature; and
a beam summer coupled to the plurality of signal generators and the probe, the beam summer configured to combine the plurality test signals into the single test beam.

4. The near-field test system of claim 3, wherein the beam forming network further comprises:
a beam divider for each antenna element of the phased array antenna, each beam divider configured to separate a received beam into received components corresponding to the unique feature for each of the plurality of test signals;
a plurality of phase shifters for each of the plurality of test signals, the plurality of phase shifters configured to steer the received components of the received beam to form the planar wave front; and
a plurality of beam summers corresponding to the plurality of test signals, the plurality of beam summers configured to combine power of the received components for each of the plurality of test signals;
wherein the computing system is further configured to:
normalize combined power of received components for each of the received beams based on the position of corresponding antenna elements for the received beams on the phased array antenna relative to the fixed location to which the single test beam is directed; and
generate the virtual spectrum for the phased array antenna from normalized combined powers of the plurality of test signals.

5. The near-field test system of claim 4, wherein the plurality of phase shifters for each of the plurality of test signals is configured to apply a spherical phase taper across the array of antenna elements to correct a spherical wave front detected by each antenna element of the phased array antenna resulting from unequal path length phases from each antenna element to the probe.

6. The near-field test system of claim 3, wherein each of the plurality of signal generators is configured to generate the beam signal having a unique feature selected from the group consisting of:
a unique frequency,
a unique timing, and
a unique code.

7. The near-field test system of claim 1, wherein the plurality of phase shifters is further configured to apply a linear phase progression across the array of antenna elements based on a distance from a center of the array to each element of the array to steer the received beams to form a planar wave front.

8. The near-field test system of claim 1, wherein the computing system comprises a spectrum analyzer configured to measure power of the received beams.

9. A method of near-field testing of a phased array antenna having an array of antenna elements, the method comprising:
transmitting a single test beam toward a fixed location on the phased array antenna from a single probe at a single fixed position in the near-field of the phased array antenna;
receiving at least a portion of the single test beam at each antenna element;
phase shifting received beams from each antenna element to apply a spherical phase taper across the array to correct a spherical wave front detected by each antenna element resulting from unequal path length phases from each antenna element to the probe, thereby producing a planar wave front;
combining power of the received beams;
scaling combined power of the received beams; and
generating a virtual spectrum for the phased array antenna from scaled power of the received beams, wherein the received beams correspond entirely to the single test beam emitted from the single probe disposed at the single fixed position.

10. The method of claim 9 further comprising phase shifting the received beams to apply a linear phase progression across the array of antenna elements based on a distance from a center of the array to each element of the array to steer the received beams to form a planar wave front.

11. The method of claim 9 further comprising:
generating a plurality of test signals having unique features; and
combining the plurality test signals into the single test beam.

12. The method of claim 11, further comprising:
dividing a received beam from each antenna element into received components corresponding to the unique feature for each of the plurality of test signals;
applying a linear phase progression to the received beams to steer the received components of each received beam to form the planar wave front; and
combining power of the received components from each antenna element for each of the plurality of test signals;
normalizing combined power of received components for each of the received beams based on positions of corresponding antenna elements for the received beams on the phased array antenna relative to the fixed location to which the single test beam is directed; and
generating the virtual spectrum for the phased array antenna from normalized combined powers of the plurality of test signals.

13. The method of claim 11, wherein generating the plurality of test signals comprises generating the plurality of test signals having a unique feature selected from the group consisting of:
a unique frequency,
a unique timing, and
a unique code.

14. The method of claim 11 further comprising comparing the virtual spectrum to an expected spectrum to verify integrity of the phased array antenna and its beam forming network for all of the plurality of test signals.

15. The method of claim 9 further comprising:
disposing the single probe at a second fixed position in the near-field of the phased array antenna; and
repeating the near-field testing of the phased array antenna to obtain signatures of at least one receiving property of the array of antenna elements.

16. The method of claim 9, wherein scaling comprises normalizing combined power of the received beams based on positions of corresponding antenna elements for the received beams on the phased array antenna relative to the fixed location to which the single test beam is directed.

17. A beam forming network for near-field testing of a phased array antenna, the beam forming network comprising:
- a plurality of phase shifters coupled to respective antenna elements of the phased array antenna, each phase shifter configured to:
- receive a received beam from the respective antenna element,
- apply a corresponding phase shift to the received beam, and
- supply the received beam to a beam summer;
- a microcontroller coupled to the plurality of phase shifters for controlling the corresponding phase shift of each element of the array, the microcontroller configured to adjust the corresponding phase shift of each element to apply a spherical phase taper across the array to correct a spherical wave front detected by each antenna element resulting from unequal path length phases from each antenna element to a probe from which a test beam originated, thereby producing a planar wave front; and
- a plurality of beam dividers corresponding to the array of antenna elements of the phased array antenna, the plurality of beam dividers configured to separate a received beam into received components corresponding to a unique feature for each of a plurality of test signals combined into a test beam received by the array of antenna elements;
- a plurality of beam summers, wherein each beam summer corresponds to the unique feature for each of the plurality of test signals, the plurality of beam summers configured to combine the received components from the respective antenna elements corresponding to the unique feature, the plurality of beam summers configured to be coupled to a computing system configured to:
  - scale combined power of the received components from each beam summer; and
  - generate a virtual spectrum for the phased array antenna from scaled power of the received components.

18. The beam forming network of claim 17, wherein the microcontroller is further configured to adjust the corresponding phase shift of each element to apply a linear phase progression across the array of antenna elements based on a distance from a center of the array to each element of the array to steer the received beams to form a planar wave front.

19. The beam forming network of claim 17 further comprising a plurality of phase shifters for each of the plurality of test signals, the plurality of test signals each having a unique feature, the plurality of phase shifters further configured to steer the received components of the received beam to form the planar wave front.

* * * * *